United States Patent
Lai et al.

(10) Patent No.: US 9,799,723 B2
(45) Date of Patent: Oct. 24, 2017

(54) SEMICONDUCTOR DEVICE AND METHOD FOR FORMING SAME

(71) Applicant: Taiwan Semiconductor Manufacturing Company, Ltd., Hsin-Chu (TW)

(72) Inventors: Jui-Yao Lai, Yuanlin Township (TW); Chun-Yi Lee, Beipu Township (TW); Shyh-Wei Wang, Hsin-Chu (TW); Yen-Ming Chen, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/797,787

(22) Filed: Jul. 13, 2015

(65) Prior Publication Data

US 2015/0318341 A1 Nov. 5, 2015

Related U.S. Application Data

(62) Division of application No. 14/336,265, filed on Jul. 21, 2014, now Pat. No. 9,082,696, which is a division of application No. 13/451,261, filed on Apr. 19, 2012, now Pat. No. 8,786,025.

(51) Int. Cl.
*H01L 49/02* (2006.01)
*H01L 29/06* (2006.01)
*H01L 23/522* (2006.01)
*H01L 27/06* (2006.01)
*H01L 29/08* (2006.01)
*H01L 21/8238* (2006.01)
*H01L 27/08* (2006.01)

(52) U.S. Cl.
CPC .......... *H01L 28/24* (2013.01); *H01L 23/5228* (2013.01); *H01L 27/0629* (2013.01); *H01L 28/20* (2013.01); *H01L 29/0649* (2013.01); *H01L 29/0847* (2013.01); *H01L 21/823842* (2013.01); *H01L 27/0802* (2013.01); *H01L 2924/0002* (2013.01)

(58) Field of Classification Search
CPC .. H01L 28/24; H01L 23/5228; H01L 27/0629
USPC ....... 257/350, 365, 379, 380, 410, 506, 536; 438/238, 382
See application file for complete search history.

(56) References Cited

U.S. PATENT DOCUMENTS

| 2004/0012008 | A1 | 1/2004 | Chen | |
| 2010/0148262 | A1* | 6/2010 | Stahrenberg | H01L 28/20 257/350 |
| 2010/0328022 | A1* | 12/2010 | Fan | H01L 27/0629 338/309 |
| 2011/0284966 | A1 | 11/2011 | Wen et al. | |

(Continued)

FOREIGN PATENT DOCUMENTS

| TW | 201025449 | 7/2010 |
| TW | 201214532 | 4/2012 |

*Primary Examiner* — Errol Fernandes
(74) *Attorney, Agent, or Firm* — Haynes and Boone, LLP (57) ABSTRACT

A system and method for forming a resistor system is provided. An embodiment comprises a resistor formed in a U-shape. The resistor may comprise multiple layers of conductive materials, with a dielectric layer filling the remainder of the U-shape. The resistor may be integrated with a dual metal gate manufacturing process or may be integrated with multiple types of resistors.

20 Claims, 7 Drawing Sheets

(56) References Cited

U.S. PATENT DOCUMENTS

2011/0298062 A1    12/2011  Ganguli et al.
2013/0270650 A1*   10/2013  Tseng ................. H01L 27/0629
                                                        257/379

* cited by examiner

SEMICONDUCTOR DEVICE AND METHOD FOR FORMING SAME

This application is a division of and claims the benefit of U.S. patent application Ser. No. 14/336,265, filed Jul. 21, 2014 and entitled "A Semiconductor Device and Method for Forming Same," which is a division of U.S. patent application Ser. No. 13/451,261, filed Apr. 19, 2012, and entitled "A Semiconductor Device and Method for Forming Same," which applications are hereby incorporated herein by reference.

BACKGROUND

Integrated circuits are generally formed on a substrate of semiconductor material out of a variety of active and passive devices. Active devices may include such devices as complementary metal oxide semiconductor (CMOS) transistors (either NMOS transistors or PMOS transistors) and may be formed from part of the semiconductor material within the substrate along with additional structures formed in conjunction with the semiconductor material. These active devices may then be interconnected using a series of conductive and insulative layers that may be formed over the active devices.

Passive devices may include such devices as resistors. These resistors may be formed to have a desired resistance to help control the desired path and functioning of the integrated circuit. The desired resistances for the resistors may be obtained by providing a desired amount of conductivities within the material of the resistors. For example, a precise amount of dopants may be introduced into a resistor that is made from a material such as polysilicon.

However, as integrated circuits and their active and passive devices have been reduced in size over the years (and as they are continuing to be miniaturized even further in the years ahead), the precision required for the manufacturing and operation of the resistors has increased. Additionally, the materials and processes used to manufacture the resistors has not kept up with the demand for high precision resistors as desired for further miniaturization while also maintaining the ease of integration for the manufacturing process that is desired for the mass production of integrated circuits.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a semiconductor device with a resistor for a 20 nm process node. Other embodiments may also be applied, however, to other semiconductor or electronic devices.

Figure 1:
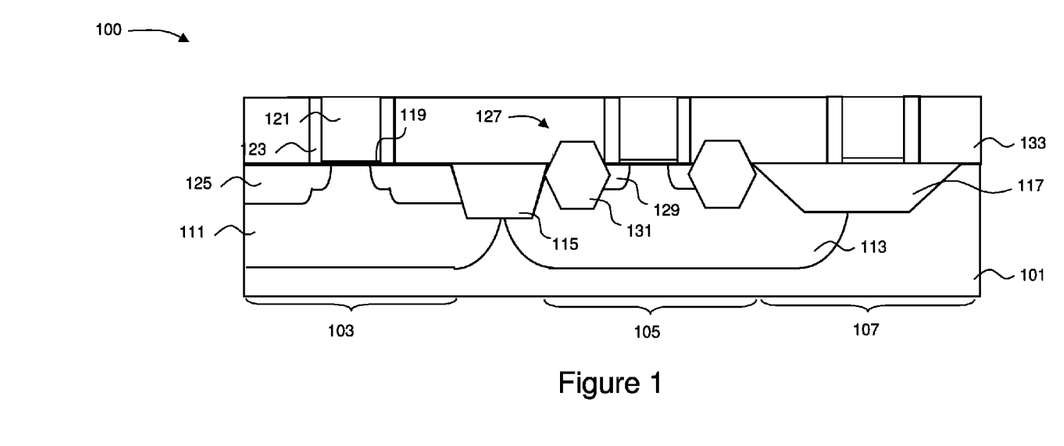
FIG. 1 illustrates a semiconductor substrate with a NMOS device region, a PMOS device region, and a resistor device region in accordance with an embodiment.

With reference now to FIG. 1, there is shown a portion of a semiconductor device 100 with a semiconductor substrate 101 that has an NMOS device region 103, a PMOS device region 105, and a resistor device region 107. The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Within the NMOS device region 103 of the semiconductor substrate 101, a P well 111 may be formed. The P well 111 may be used to provide a p-type conductivity for a NMOS transistor 604 (not illustrated in FIG. 1 but illustrated and discussed below with respect to FIG. 6) to be formed in conjunction with the P well 111. In an embodiment the P well 111 may be formed by implanting p-type dopants (e.g., boron, gallium, indium, or the like) into the NMOS device region 103 of the semiconductor substrate 101, although any other suitable method for forming the P well 111 may alternatively be utilized.

Within the PMOS device region 105 of the semiconductor substrate 101, an N well 113 may be formed. The N well 113 may be used to provide an n-type conductivity base for a PMOS transistor 605 (not illustrated in FIG. 1 but illustrated and discussed below with respect to FIG. 6) to be formed in conjunction with the N well 113. In an embodiment the N well 113 may be formed by implanting n-type dopants (e.g., phosphorous, arsenic, antimony, or the like) into the PMOS device region 105 of the semiconductor substrate 101, although any suitable method for forming the N well 113 may alternatively be utilized.

A first isolation region 115 may be formed within the semiconductor substrate 101 between the NMOS device region 103 and the PMOS device region 105 in order to isolate the NMOS device region 103 and the PMOS device region 105 from each other. In an embodiment the first isolation region 115 is a shallow trench isolation (STI), and may be formed by etching the semiconductor substrate 101 to form a trench and filling the trench with a dielectric material as is known in the art. For example, the first isolation region 115 may be filled with a dielectric material such as an oxide material, a high-density plasma (HDP) oxide, or the like, formed by methods known in the art.

A second isolation region 117 may also be formed within the semiconductor substrate 101 in order to provide a non-conductive surface upon which a resistor 602 (not illustrated in FIG. 1 but illustrated and discussed below with respect to FIG. 6) may be formed without contacting the semiconductor substrate 101. In an embodiment the second isolation region 117 may be formed to a depth below a top surface of the semiconductor substrate 101 of between about 150 nm and about 250 nm, such as about 200 nm. Additionally, the second isolation region 117 may be formed to have a width large enough to provide space for the resistor 602. As such, in an embodiment, while the width of the second isolation region 117 may at least in part dependent upon the dimensions of the resistor 602, the second isolation region 117 may have a width of between about 0.3 µm and about 2 µm, such as about 1 µm.

In an embodiment the second isolation region 117 may be formed using similar processes (or even the same processes and at the same time) as the first isolation region 115. For example, the second isolation region 117 may also be an STI formed by initially forming a trench and then filling the trench with a dielectric material. However, the second isolation region 117 may alternatively be formed separately from the first isolation region 115 using different processes or materials. Any suitable process or combination of processes may be used to form the first isolation region 115 and the second isolation region 117, and all such processes are fully intended to be included within the scope of the present embodiments.

Over the semiconductor substrate 101, first dummy interface layers 119, dummy gate electrodes 121, and spacers 123 may be formed. The first dummy interface layers 119 may be a dielectric material, such as silicon oxide, silicon oxynitride, silicon nitride, an oxide, a nitrogen-containing oxide, a combination thereof, or the like, and may be formed by thermal oxidation, nitridation, CVD, or the like. The first dummy interface layers 119 may have a thickness of between about 1 nm and about 10 nm, such as about 4 nm.

The dummy gate electrodes 121 may comprise a material, such as a doped or undoped poly-crystalline silicon (or amorphous silicon), a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), other conductive materials, combinations thereof, or the like. In an embodiment in which the dummy gate electrodes 121 are poly-silicon, the dummy gate electrodes 121 may be formed by depositing doped or undoped poly-silicon by low-pressure chemical vapor deposition (LPCVD) to a thickness in the range of about 400 Å to about 2,400 Å, such as about 1,400 Å.

Once the first dummy interface layers 119 and the dummy gate electrodes 121 have been formed, the first dummy interface layers 119 and dummy gate electrodes 121 may be patterned. In an embodiment, the first dummy interface layers 119 and the dummy gate electrodes 121 may be patterned using, e.g., a photolithographic masking and etching process, whereby a photolithographic mask (not shown in FIG. 1) is formed over the dummy gate electrodes 121 and then exposed to a patterned light. After exposure, desired portions of the photolithographic mask are removed to exposed the underlying dummy gate electrodes 121, which may then be etched to remove the exposed portions, thereby patterning the dummy gate electrodes 121 and the first dummy interface layers 119.

The spacers 123 may be formed by blanket depositing one or more spacer layers (not shown) over the dummy gate electrodes 121 and the semiconductor substrate 101. The spacer layers may comprise SiN, oxynitride, SiC, SiON, oxide, and the like and may be formed by commonly used methods such as chemical vapor deposition (CVD), plasma enhanced CVD, sputter, and other methods known in the art. The spacer layers may be patterned, such as by isotropically or anisotropically etching, thereby removing the spacer layers from the horizontal surfaces of the structure and forming the spacers 123 as illustrated in FIG. 1.

However, as one of ordinary skill in the art will recognize, the process described above and the resulting shape of the spacers 123 as illustrated in FIG. 1 are intended to be merely illustrative and are not intended to limit the embodiments to these descriptions. Rather, any suitable number and combination of spacers layers and shapes may be utilized in order to form the spacers 123, and any suitable combination of spacers may alternatively be utilized.

First source/drain regions 125 may be formed within the NMOS device region 103 of the semiconductor substrate 101 on opposing sides of the first dummy interface layers 119 over the NMOS device region 103. In an embodiment, the first source/drain regions 125 may be formed so as to define a channel region located beneath the first dummy interface layers 119 within the NMOS device region 103. The first source/drain regions 125 may be formed by protecting the PMOS device region 105 and the resistor device region 107 with e.g., a mask, and then performing one or more implantations of impurities, such as n-type impurities, into the semiconductor substrate 101. The first source/drain regions 125 may be formed such that the device is an NMOS device. Because the dummy gate electrode 121 and spacers 123 are used as masks, the first source/drain regions 125 are substantially aligned with the dummy gate electrode 121 and the respective spacers 123 within the NMOS device region 103.

It should be noted that, though the above-described process to form the first source/drain regions 125 describes a specific process, one of ordinary skill in the art will realize that many other processes, steps, or the like may be used. For example, one of ordinary skill in the art will realize that a plurality of implants may be performed using various combinations of spacers and liners to form first source/drain regions 125 having a specific shape or characteristic suitable for a particular purpose. Any of these processes may be used to form the first source/drain regions 125, and the above description is not meant to limit the present invention to the steps presented above.

Second source/drain regions 127 may be formed within the PMOS device region 105 on opposing sides of the first dummy interface layers 119 and dummy gate electrode 121 within the PMOS device region 105 of the semiconductor substrate 101. The second source/drain regions 127 may be, for example, composite regions, wherein the second source/drain regions 127 comprise implant regions 129 formed from the semiconductor substrate 101 and raised regions 131 adjacent to the implant regions 129. The implant regions 129 may be formed so as to define a channel region located beneath the first dummy interface layers 119 within the PMOS device region 105. The implant regions 129 may be formed by protecting the NMOS device region 103 and the resistor device region 107 with e.g., a mask, and then performing one or more implantations of impurities prior to the formation of the spacers 123, such as p-type impurities, into the semiconductor substrate 101. The implant regions 129 may be formed such that the device is a PMOS device. Because the dummy gate electrode 121 is used as a mask, the implant regions 129 are substantially aligned with the dummy gate electrode 121 within the PMOS device region 105.

After the implant regions 129 and spacers 123 have been formed, the raised regions 131 may be formed to provide a raised source/drain region for the PMOS device. The raised regions 131 may be formed by initially forming recesses (not shown) in the semiconductor substrate 101 and epitaxially growing material in the recesses. In an embodiment, the recesses may be formed by an anisotropic etch. Alternatively, the recesses may be formed by an isotropic orientation dependent etching process, wherein tetramethylammonium hydroxide (TMAH) or the like may be used as an etchant.

After the recesses are formed, the raised regions 131 may be formed by epitaxially growing material in the recesses. During the epitaxy process, etching gas, such as HCl gas, may be added (as an etching gas) into the process gas, so that the raised regions 131 are selectively grown in the recesses, but not on the gate structures or the resistor structure. In another embodiment, the NMOS device region 103 and the resistor device region 107 could be covered with a sacrificial layer (not shown) to prevent epitaxial growth thereon. The raised regions 131 may be doped either through an implantation method as discussed above, or else by in-situ doping as the material is grown.

The formation methods of the raised regions 131 may include atomic layer deposition (ALD), CVD, such as a reduced pressure CVD (RPCVD), metalorganic chemical vapor deposition (MOCVD), or other applicable methods. Depending on the desirable composition of the raised regions 131, the precursors for the epitaxial may include Si-containing gases and Ge-containing gases, such as $SiH_4$ and $GeH_4$, and/or the like, and the partial pressures of the Si-containing gases and Ge-containing gases are adjusted to modify the atomic ratio of germanium to silicon.

In another embodiment the raised regions 131 may be formed so as to impart a strain on the channel region underneath the first dummy interface layers 119 within the PMOS device region 105. In an embodiment wherein the semiconductor substrate 101 comprises silicon, the raised regions 131 may then be formed through a selective epitaxial growth (SEG) process with a material, such as silicon germanium, silicon carbon, or the like that has a different lattice constant than the silicon. The lattice mismatch between the stressor material in the raised regions 131 and the channel region formed underneath the first dummy interface layers 119 within the PMOS device region 105 will impart a stress into the channel region that will increase the carrier mobility and the overall performance of the device.

A first interlayer dielectric (ILD) layer 133 may be formed over the semiconductor substrate 101, the dummy gate electrodes 121, and the spacers 123. In an embodiment the first ILD layer 133 may be formed by ALD, PVD, CVD, or other acceptable methods for forming an ILD. The first ILD layer 133 may comprise doped or undoped silicon oxide, although other materials such as silicon nitride doped silicate glass, high-k materials, combinations of these, or the like, may alternatively be utilized. After formation of the first ILD layer 133, the first ILD layer 133, the dummy gate electrodes 121, and the spacers 123 may be planarized using suitable techniques such as a chemical mechanical polish (CMP) process.

Figure 2A:
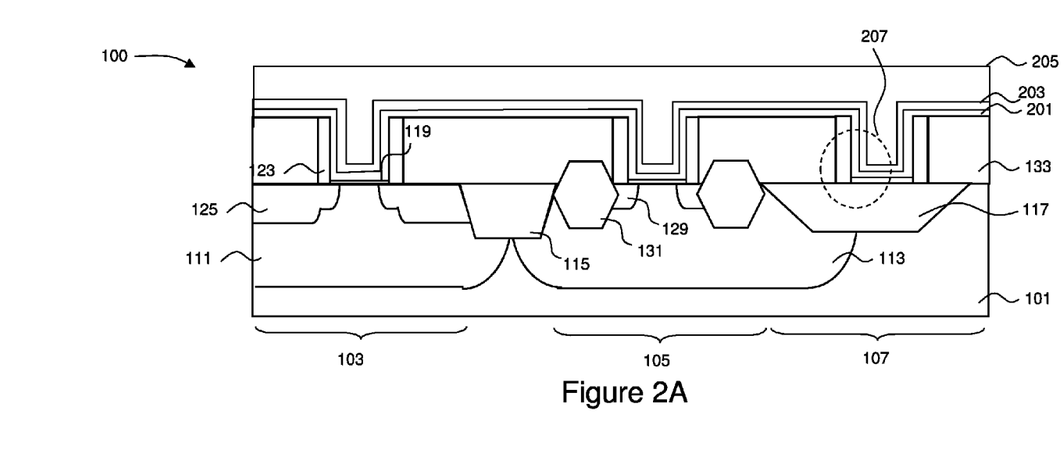
FIGS. 2A-2B illustrate a first dielectric layer, a first metal layer, and a second dielectric layer over the semiconductor substrate in accordance with an embodiment.

FIG. 2A illustrates a removal of the dummy gate electrodes 121 and the first dummy interface layers 119 and the formation of a first dielectric layer 201 and a first metal layer 203 over the first ILD layer 133 and the spacers 123. The dummy gate electrodes 121 and the first dummy interface layers 119 may be removed using a removal process suitable for the material that was chosen to form the dummy gate electrodes 121 and the first dummy interface layers 119. As such, while the precise method of removal will be at least in part dependent upon the material chosen, in an embodiment in which the dummy gate electrodes 121 are polysilicon and the and the first dummy interface layers 119 are silicon oxide, the dummy gate electrodes 121 may be removed using a process such as plasma etching with an etchant such as $HBr/Cl_2$, $F_2$, or a wet etching such as $NH_4OH$, combinations of these, or the like.

Once the dummy gate electrodes 121 and the first dummy interface layers 119 have been removed, the first dielectric layer 201 may be formed. In an embodiment the first dielectric layer 201 may be a high-k dielectric layer, and may include hafnium oxide ($HfO_2$) or else a silicate oxide such as $HfSiO_x$. In alternative embodiments, the first dielectric layer 201 includes other hafnium-containing materials such as $HfZrO_x$, $HfAlO_x$, $HfLaO_x$, $HfO_2$, $HfTiO_x$, $HfTaO_x$, $HfTiTaO_x$, and combinations thereof. In yet other embodiments, the first dielectric layer 201 may include metal oxides such as $LaO_3$, $ZrO_2$, $Al_2O_3$, $Ta_2O_5$, $TiO_2$, and combinations thereof. The first dielectric layer 201 may have a thickness of between about 8 Å and about 40 Å, such as about 19 Å, and may be formed using a deposition process such as atomic layer deposition (ALD). However, other commonly used methods such as plasma enhanced chemical vapor deposition (PECVD), low-pressure chemical vapor deposition (LPCVD), metal-organic chemical vapor deposition (MOCVD), plasma enhanced atomic layer deposition (PEALD), and the like, can also be used.

Figure 2B:
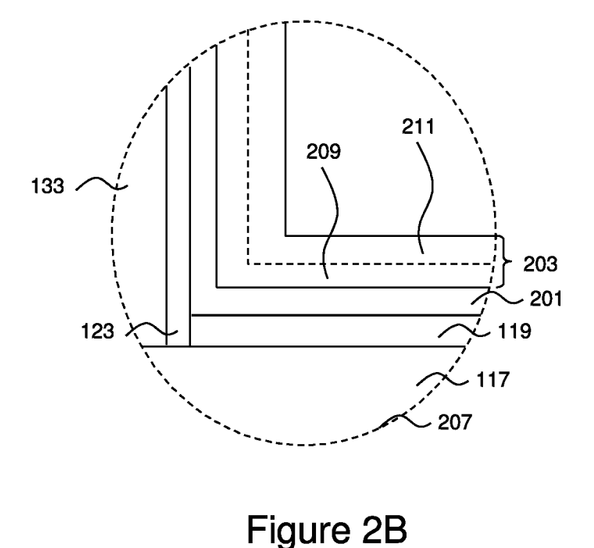

FIG. 2B illustrates a close up view of the dashed circle 207 in FIG. 2A and helps to illustrate the formation of the first metal layer 203 over the first dielectric layer 201. In an embodiment the first metal layer 203 may be formed from multiple sublayers, such as a first sublayer 209 and a second sublayer 211. The first sublayer 209 may be formed from a barrier material such as titanium nitride, tantalum nitride, a combination of titanium nitride and tantalum nitride (such as a layer of titanium nitride underlying a layer of tantalum nitride), and may be formed using CVD, PVD, ALD, combinations of these, or the like. In an embodiment in which the first sublayer 209 is formed from a layer of titanium nitride and layer of tantalum nitride, the layer of titanium nitride may have a first thickness of between about 5 Å and about 100 Å, such as about 25 Å, and the layer of tantalum nitride may have a thickness of between about 5 Å and about 100 Å, such as about 15 Å.

The second sublayer 211 may be utilized to adjust the work function of the first sublayer 209, and, optionally, may be a material that may also be utilized as a gate electrode for the device located in the PMOS device region 105. As such, while the precise material of the second sublayer may be dependent at least in part on the material chosen for the first sublayer 209, in an embodiment in which the first sublayer 209 comprises a layer of titanium nitride and a layer of tantalum nitride, the second sublayer 211 may be formed of titanium nitride in order to adjust the work function of the first sublayer 209. The second sublayer 211 may be formed using a deposition process such as ALD, PVD, or CVD, and may be formed to a thickness of between about 10 Å and about 200 Å, such as about 50 Å.

Returning to FIG. 2A, after the first metal layer 203 has been formed over the first dielectric layer 201, a second dielectric layer 205 may be formed to fill and overfill the openings left behind by removing the dummy gate electrodes 121. The second dielectric layer 205 may be, e.g., a spin-on glass (SOG), and may be a silicate, a siloxane, a polysiloxane, an organic siloxane, combinations of these, or the like. In an embodiment the second dielectric layer 205 may be formed by introducing a solvent including a SOG solute (e.g., silicate) while the semiconductor substrate 101 is spinning at a pre-determined spin rate. The centripetal forces from the spinning evenly coats the solvent and solute solution over the semiconductor substrate 101 and into the remaining portions of the openings left behind by the removal of the dummy gate electrodes 121. After the solvent has been planarized, the solvent may then be cured using a process such as thermal baking, in which the solvent is heated to a temperature of between about 150° C. to about 450° C.

This process of spinning and baking may be repeated, if desired, to obtain a desired thickness of the second dielectric layer 205. In an embodiment, the process may be repeated until the second dielectric layer 205 has a thickness above a highest point of the first metal layer 203 of between about 500 Å and about 5000 Å, such as about 1000 Å. However, any suitable thickness may be utilized.

Additionally, while the second dielectric layer 205 has been described as being a SOG layer, this description is not intended to limit the second dielectric layer 205 to a SOG layer. Other suitable dielectric materials, such as silicon oxide formed through a CVD process, silicon nitride formed through a CVD process, plasma enhanced CVD, combinations of these, or the like, may alternatively be utilized. These and any other suitable material for protecting the first metal layer 203 in the PMOS device region 105 and the resistor device region 107 are fully intended to be included within the scope of the embodiments.

Figure 3:
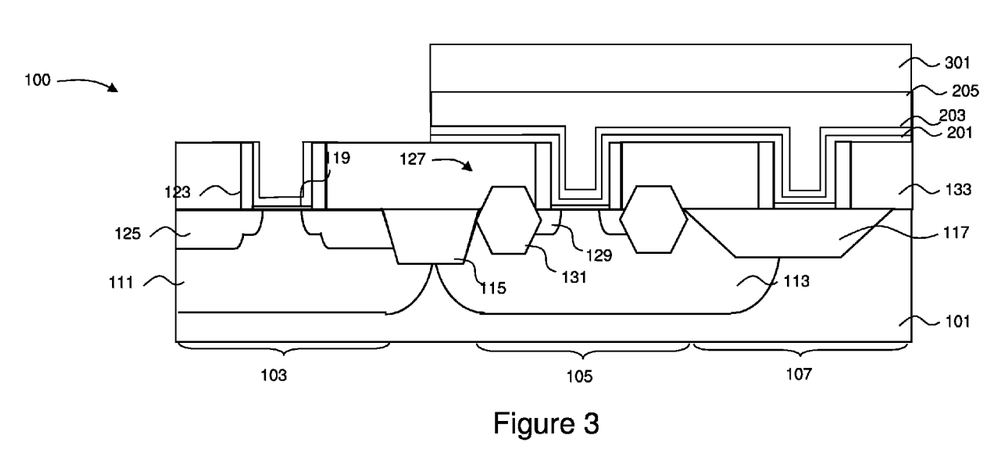
FIG. 3 illustrates a first patterning of the first dielectric layer, the first metal layer, and the second dielectric layer in accordance with an embodiment.

FIG. 3 illustrates the formation and patterning of a first photoresist 301. The first photoresist 301 may comprise a conventional photoresist material, such as a deep ultra-violet (DUV) photoresist, and may be deposited over the second dielectric layer 205, for example, by using a spin-on process. However, any other suitable material or method of forming or placing the first photoresist 301 may alternatively be utilized.

Once the first photoresist 301 has been placed over the second dielectric layer 205, the first photoresist 301 may be patterned. In an embodiment the first photoresist 301 may be formed to provide protection from a subsequent etching process (described further below) to the PMOS device region 105 and the resistor device region 107. The first photoresist 301 may be patterned by exposing the first photoresist 301 to an energy source such as light through a patterned reticle in order to induce a reaction in those portions of the first photoresist 301 exposed to the energy source. Once the reactions have occurred, a positive or negative developer may be utilized to develop the first photoresist 301, and the desired portions of the first photoresist 301 may be removed, leaving behind the first photoresist 301 as a mask.

Once the first photoresist 301 has been formed to mask the PMOS device region 105 and the resistor device region 107, the first metal layer 203 may be removed from the NMOS device region 103 and the first dielectric layer 201 may be removed from over the first ILD layer 133 while remaining within the opening left behind by the removal of the dummy gate electrode 121 in the NMOS device region 103. In an embodiment the first metal layer 203 and the first dielectric layer 201 may be removed using one or more etching processes, such as an anisotropic etch, using the first photoresist 301 as a mask. For example, in an embodiment the first metal layer 203 may be removed using an etchant such as HCl. However, any suitable removal process or combination of removal processes may alternatively be utilized.

Figure 4:
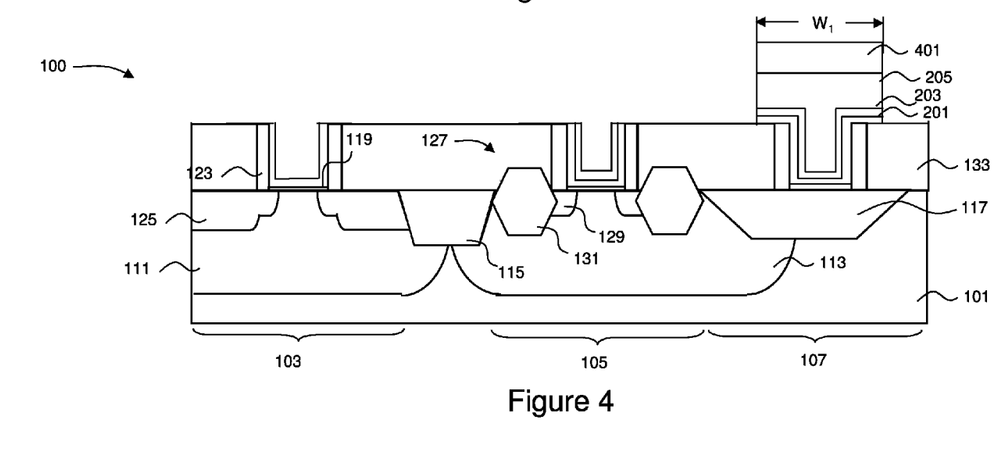
FIG. 4 illustrates a second patterning of the first dielectric layer, the first metal layer, and the second dielectric layer in accordance with an embodiment.

FIG. 4 illustrates a removal of the first photoresist 301, a formation of a second photoresist 401, and a second patterning of the second dielectric layer 205. The first photoresist 301 may be removed using a process such as ashing, whereby the temperature of the first photoresist 301 may be increased until the first photoresist 301 experiences a thermal decomposition and may be removed. However, any other suitable process for removing the first photoresist 301 may alternatively be utilized.

Once the first photoresist 301 has been removed, the second photoresist 401 may be formed on the second dielectric layer 205. The second photoresist 401 may be similar to the first photoresist 301, and may be formed in a similar fashion as described above with respect to FIG. 3. For example, the second photoresist 401 may be a DUV photoresist and may be applied using a spin-coating technique, although other suitable materials and methods may alternatively be utilized.

After the second photoresist 401 has been applied, the second photoresist 401 may be patterned in order to protect the second dielectric layer 205 located in the resistor device region 107 of the semiconductor substrate 101. In an embodiment the second photoresist 401 may be patterned to have a first width $W_1$ of between about 0.3 μm and about 2 μm, such as about 1 μm. As such, during etching this first width $W_1$ will be transferred to the underlying second dielectric layer 205.

The second photoresist 401 may be patterned in a similar fashion as the first photoresist 301 (described above with respect to FIG. 3). For example, the second photoresist 401 may be exposed to an energy source such as light through a patterned reticle, and the second photoresist may then be developed using a positive or negative developer. Undesired portions of the second photoresist 401 may then be removed to form a mask over those portions of the second dielectric layer 205 that are desired to remain.

Once the second dielectric layer 205 over the resistor device region 107 of the semiconductor substrate 101 has been protected by the second photoresist 401, those portions of the first metal layer 203 and the first dielectric layer 201 over the first ILD layer 133 in the PMOS device region 105 may be removed while leaving behind the first metal layer 203 and the first dielectric layer 201 in the opening left behind by the removal of the dummy gate electrode 121 in the PMOS device region 105. The removal may be performed using one or more removal processes. For example, in an embodiment the first metal layer 203 may be removed using an etchant such as HCl. However, any suitable process or combination of processes may be utilized to remove the first metal layer 203 and the first dielectric layer 201 from over the first ILD layer 133 in the PMOS device region 105.

Figure 5:
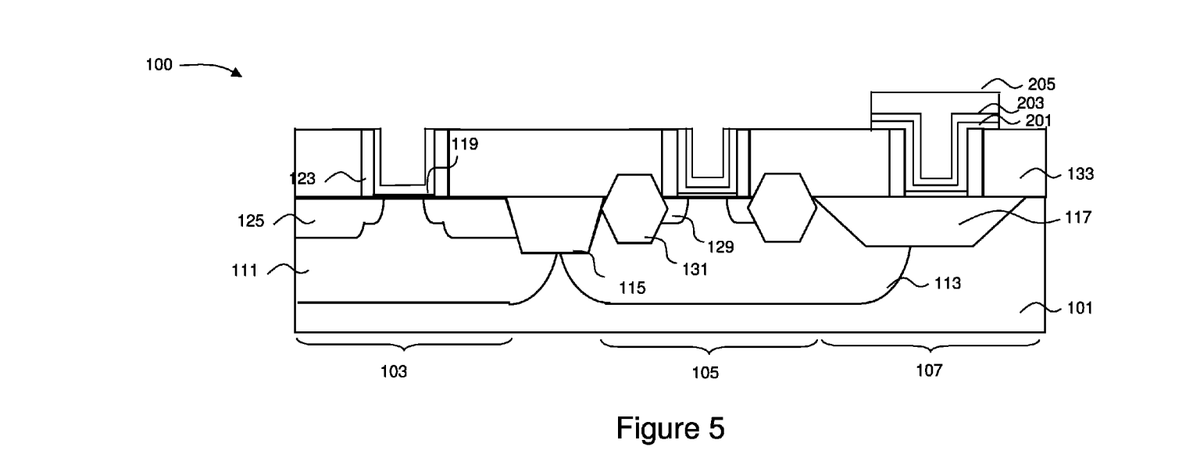
FIG. 5 illustrates an etch back of the second dielectric layer in accordance with an embodiment.

FIG. 5 illustrates a removal of the second photoresist 401 and an optional etch back of the second dielectric layer 205. In an embodiment the second photoresist 401 may be removed using a process such as ashing, whereby the temperature of the second photoresist 401 may be increased until the second photoresist 401 experiences a thermal decomposition and may be removed. However, any other suitable process for removing the second photoresist 401 may alternatively be utilized.

Once the second photoresist 401 has been removed from the second dielectric layer 205, the second dielectric layer 205 may be etched back in order to decrease the thickness of the second dielectric layer 205 in the resistor device region 107 and to make a subsequent planarization (discussed further below with respect to FIG. 6) easier. In an embodiment the second dielectric layer 205 may be etched back to a thickness above the top of the first metal layer 703 of between about 100 Å and about 500 Å, such as about 300 Å, using an etchant such as $CF_4$ and $CHF_3$. However, other etchants or methods of etching back the second dielectric layer 205 may alternatively be utilized.

Figure 6:
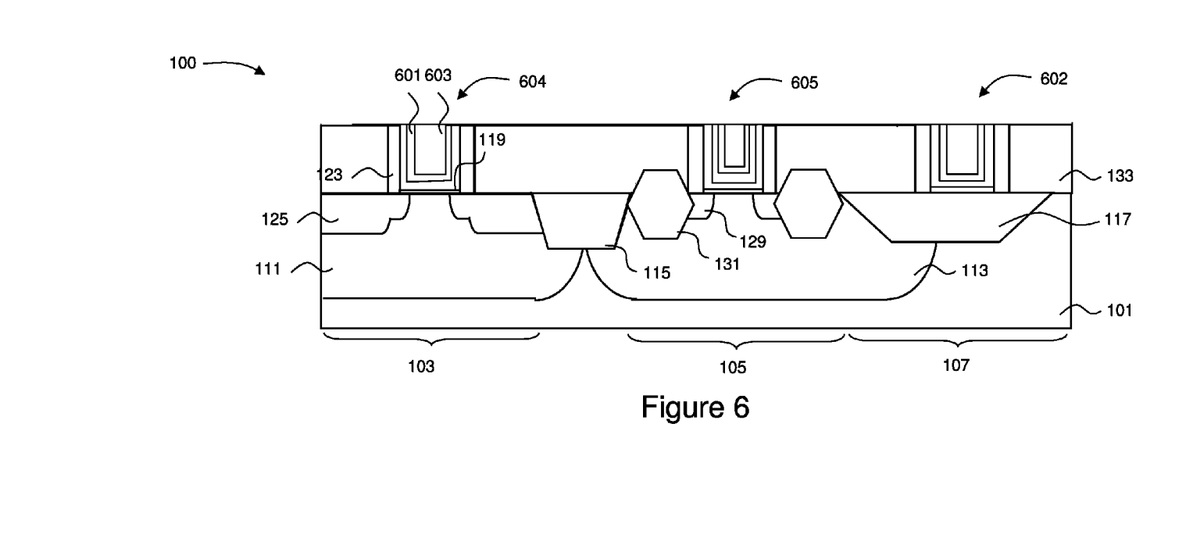
FIG. 6 illustrates a planarization process in accordance with an embodiment.

FIG. 6 illustrates the formation of a second metal layer 601 and a gate fill material 603 in the openings formed by the removal of the dummy gate electrodes in the NMOS device region 103 and the PMOS device region 105. However, because the second dielectric layer 205 is blocking the deposition of the second metal layer 601 and the gate fill material 603 into the opening left behind by the removal of the dummy gate electrode 121 in the resistor device region 107, none of the second metal layer 601 or the gate fill material 603 may be deposited into that opening. In an embodiment the second metal layer 601 may be a metal suitable for use in a NMOS device such as Al, Ti, TiAl, or Ta. The second metal layer 601 may be formed using a process of formation such as CVD, PVD, or ALD, and may be formed to a thickness of between about 10 Å and about 100 Å, such as about 50 Å.

The gate fill material 603 may be a material utilized to fill in the openings left by the dummy gate electrodes 121 in the NMOS device region 103 and the PMOS device region 105. The gate fill material 603 may be aluminum (Al), although any other suitable material, such as AlSiCu, or AlCu, may alternatively be utilized. The gate fill material 603 may be blanket deposited to fill and overfill the openings left by the removal of the dummy gate electrodes 121 in the NMOS device region 103 and the PMOS device region 105 and also deposit over the second dielectric layer 205 in the resistor device region 107.

FIG. 6 also illustrates a planarization process, such as a CMP process, that may be used to remove the second dielectric layer 205, the second metal layer 601, the gate fill material 603, from over the first ILD layer 133. This planarization process helps to form an NMOS transistor 604 in the NMOS device region 103, a PMOS transistor 605 in the PMOS device region 105, and a resistor 602 in the resistor device region 107. The planarization process additionally removes the second dielectric layer 205 and the second metal layer 601 such that, within the opening left by the removal of the dummy gates 121 in the resistor region 107, the second dielectric layer 205 lines the sidewalls and bottom of the opening, forming the shape of a "U." Additionally, as the second metal layer 601 lines the second dielectric layer 205, the second metal layer 601 is also in the shape of a "U."

Once the NMOS transistor 604, the PMOS transistor 605, and the resistor 602 have been formed, they may be interconnected to each other and to other active and passive devices on the semiconductor substrate 101. For example, a series of alternating conductive and insulating layers may be formed over the NMOS transistor 604, the PMOS transistor 605, and the resistor 602, including contacts to make electrical connection to the NMOS transistor 604, the PMOS transistor 605, and the resistor 602. These interconnecting layers of conductive and insulative materials provide the desired circuitry to connect the NMOS transistor 604, the PMOS transistor 605, and the resistor 602 as desired to either internal or external devices.

By forming the resistor 602 in the U-shape described above, the resistor 602 may meet the ongoing reduction of devices in the semiconductor field, such as in 20 nm process nodes while also meeting the desired sheet resistance (such as between about 400 and about 1000 ohm/sq). Additionally, by forming the resistor concurrently with the dual metal gate process, the formation of the resistor 602 may be easily incorporated into current manufacturing processes with only one additional photoresist masking process such as the second photoresist 401. This easy integration allows for the resistor 602 to be easily incorporated into current manufacturing processes with a smaller cost and more efficiently than the manufacturing of other types of resistors.

Figure 7:
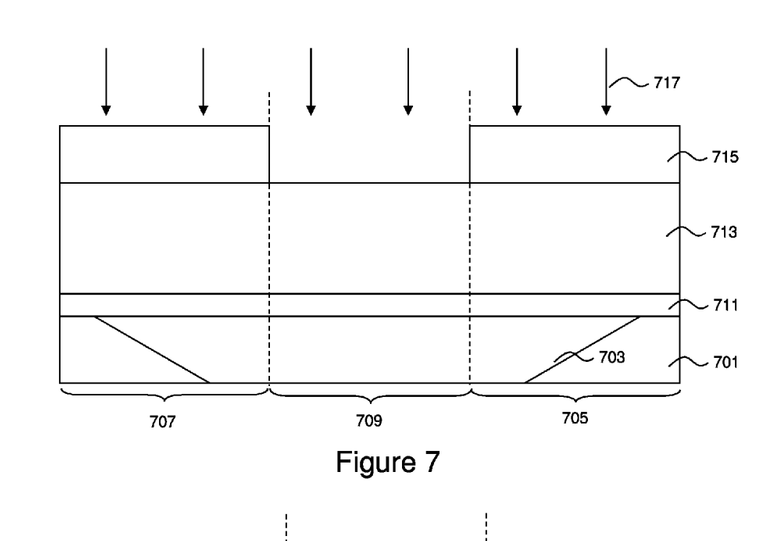
FIG. 7 illustrates a second embodiment of multiple resistors on a substrate in accordance with an embodiment.

FIG. 7 helps to illustrate another embodiment in which the resistor 602 may be formed on a third isolation region 703 of a second substrate 701 along with other types of resistors, such as a first type of resistor 1203 (e.g., a metal resistor, not illustrated in FIG. 7 but illustrated and discussed below with respect to FIG. 12) and a second type of resistor 801 (e.g., a polysilicon resistor, not illustrated in FIG. 7 but illustrated in FIG. 8 below). In this embodiment the resistor 602 may have a resistance of between about 400 to about 900 ohm/sq, the first type of resistor 1203 may have a resistance of less than about 100 ohm/sq, and the second type of resistor 801 may have a resistance of between about 700 and about 1000 ohm/sq.

The second substrate 701 and the third isolation region 703 in this embodiment may be similar materials and formed from similar processes as the semiconductor substrate 101 and the second isolation region 117 (described above with respect to FIG. 1). For example, the second substrate 701 may be a silicon substrate and the third isolation region 703 may be an STI formed within the silicon substrate. However, the second substrate 701 and the third isolation region 703 may alternatively be different materials and made from different methods than the semiconductor substrate 101 and the second isolation region 117.

The third isolation region 703 in the second substrate 701 may have a second resistor region 705, a first type of resistor region 707, and a second type of resistor region 709. It should be noted that while the second resistor region 705, the first type of resistor region 707 and the second type of resistor region 709 are illustrated as being formed over the third isolation region 703, this description is not intended to be limiting. Alternatively, the second resistor region 705, the first type of resistor region 707, and the second type of resistor region 709 may be formed over multiple isolation regions that are separated from each other, and in some combination thereof. Any suitable combination of isolation regions and resistor regions may used, and all such combinations are fully intended to be included within the scope of the embodiments.

Over the third isolation region 703, a second dummy interface layer 711 may be formed. The second dummy interface layer 711 may be formed from similar materials and similar processes as the first dummy interface layers 119 (described above with respect to FIG. 1). For example, the second dummy interface layer 711 may be a thermal or CVD oxide or nitride. The second dummy interface layer 711 may be formed to a thickness of between about 10 Å and about 100 Å, such as about 50 Å.

After the second dummy interface layer 711 has been formed, a dummy layer 713 may be formed over the second dummy interface layer 711. In an embodiment the second layer 713 may be similar to the dummy electrode 121 (described above with respect to FIG. 1), such as a polycrystalline silicon material. The dummy layer 713 may be formed using CVD, PVD, ALD, or the like to a thickness of between about 300 Å and about 1000 Å, such as about 800 Å. In an embodiment the polysilicon material may be formed undoped, although alternatively the polysilicon material may be doped in-situ during the formation process.

Over the dummy layer 713 a third photoresist 715 may be formed. The third photoresist 715 may be used as an implantation mask in order to protect the first type of resistor region 707 and the second resistor region 705 from a subsequent implantation while exposing the dummy layer 713 within the second type of resistor region 709 for the subsequent implantation. The third photoresist 715 may be similar to the first photoresist 301, and may be formed in a similar fashion as described above with respect to FIG. 3. For example, the third photoresist 715 may be a (DUV) photoresist and may be applied using a spin-coating technique, although other suitable materials and methods may alternatively be utilized. After the third photoresist 715 has been applied, the third photoresist 715 may be patterned in order to protect the protect the dummy layer 713 in the first type of resistor region 707 and the second resistor region 705 while exposing the dummy layer 713 in the second type of resistor region 709.

After the third photoresist 715 has been patterned to expose the dummy layer 713 within the second type of resistor region 709, a first implantation (represented in FIG. 7 by the arrows labeled 717) may be performed to dope the exposed portions of the dummy layer 713 in the second type of resistor region 709. The first implantation 717 may implant n-type or p-type dopants into the dummy layer 713 and may implant the desired dopants to a desired concentration for the desired second type of resistor 801. As such, while the concentration is at least in part dependent upon the desired resistance, the first implantation 717 may implant the dopants to a concentration of between about 1E15 (1/cm$^2$) and about 5E15 (1/cm$^2$), such as about 3E15 (1/cm$^2$).

Figure 8:
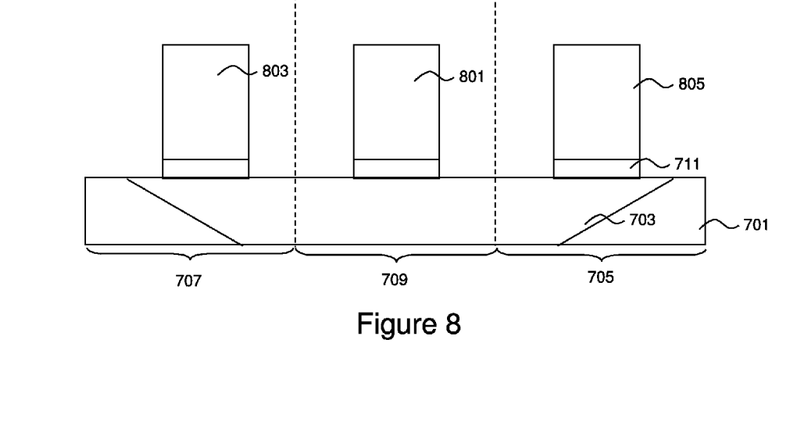
FIG. 8 illustrates a forming of a polysilicon resistor in accordance with an embodiment.

FIG. 8 illustrates that, once the dummy layer 713 within the second type of resistor region 709 has been doped, the third photoresist 715 may be removed using a suitable process such as ashing or $H_2SO_4$, and the dummy layer 713 may be patterned into the second type of resistor 801, a first dummy region 803 in the first type of resistor region 707, and a second dummy region 805 in the second resistor region 705. The dummy layer 713 may be patterned using a suitable photolithographic masking and etching process, whereby a photoresist mask (not individually illustrated in FIG. 8) is applied and patterned so that it protects those areas that are desired to remain, and an etchant is utilized to remove any exposed regions of the dummy layer 713. In an embodiment the second type of resistor 801, the first dummy region 803, and the second dummy region 805 may each have a width of between about 0.02 μm and about 5 μm, such as about 0.36 μm.

Figure 9:
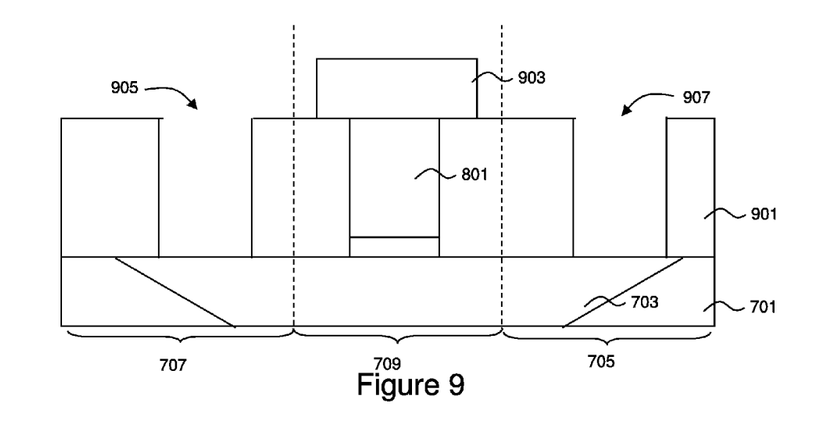
FIG. 9 illustrates a removal of dummy regions in accordance with an embodiment.

FIG. 9 illustrates that, once the dummy layer 713 has been patterned into the second type of resistor 801, the first dummy region 803, and the second dummy region 805, a third ILD layer 901 may be formed over the second type of resistor 801, the first dummy region 803, and the second dummy region 805 in order to isolate the second type of resistor 801, the first dummy region 803, and the second dummy region 805. The third ILD layer 901 may be formed from similar materials and using similar processes as the first ILD layer 133 (discussed above with respect to FIG. 1), although other materials or processes may alternatively be utilized. Once formed, the third ILD layer 901, the second type of resistor 801, the first dummy region 803, and the second dummy region 805, may be planarized using a process such as CMP.

After the third ILD layer 133 has been formed, a fourth photoresist 903 may be formed to protect the second type of resistor 801 during a subsequent removal of the first dummy region 803 and the second dummy region 805. The fourth photoresist 903 may be similar to the first photoresist 301, and may be formed in a similar fashion as described above with respect to FIG. 3. For example, the fourth photoresist 903 may be a DUV photoresist and may be applied using a spin-coating technique, although other suitable materials and methods may alternatively be utilized. After the fourth photoresist 903 has been applied, the fourth photoresist 903 may be patterned in order to protect the second type of resistor 801 while exposing the first dummy region 803 and the second dummy region 805.

Once the second type of resistor 801 has been protected by the fourth photoresist 903, the first dummy region 803 and the second dummy region 805 may be safely removed from the third ILD layer 901 without harming the second type of resistor 801. The removal may be performed using a wet or dry etch process using an etchant such as $HBr/Cl_2$. The removal of the first dummy region 803 and the second dummy region 805 leave behind first opening 905 and second opening 907, respectively.

Figure 10:
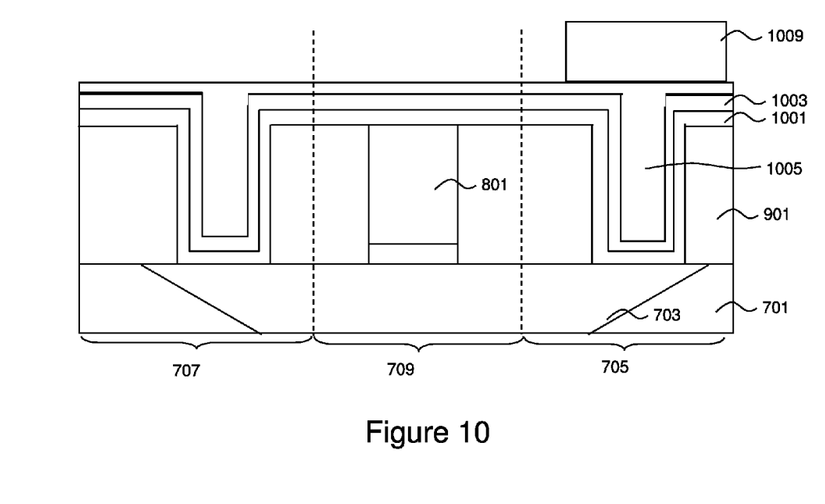
FIG. 10 illustrates a formation of a dielectric layer and a metal layer in accordance with an embodiment.

FIG. 10 illustrates that, after the first dummy region 803 and the second dummy region 805 have been removed, the fourth photoresist 903 may be removed using a process such as ashing, and a third dielectric layer 1001 and a third metal layer 1003 may be formed lining the first opening 905 and the second opening 907. In an embodiment the third dielectric layer 1001 may be formed in a third dielectric layer 1001 "last" type of process (in which the third dielectric layer 1001 is formed after the third ILD layer 901) rather than a third dielectric layer 1001 "first" type of process in which the third dielectric layer 1001 may be formed over the third insulating region 703 and then patterned, which would cause the third dielectric layer 1001 to only be located along a bottom of the second opening 907 and not along the sidewalls. The third dielectric layer 1001 and the third metal layer 1003 may made from similar materials and may be formed using similar processes as the first dielectric layer 201 and the first metal layer 203 (described above with respect to FIG. 2), respectively. For example, the third dielectric layer 1001 may be a high-k dielectric such as hafnium oxide, and the third metal layer 1003 may be a composite layer of titanium nitride, tantalum nitride, and titanium nitride.

Once the third metal layer 1003 has been formed, a fourth dielectric layer 1005 may be formed to fill and overfill the remainder of the first opening 905 and the second opening 907. The fourth dielectric layer 1005 may be formed of similar materials and using similar processes as the second dielectric layer 205 (described above with respect to FIG. 2).

For example, the fourth dielectric layer 1005 may be SOG formed using a spin-coating process. However, other suitable processes and materials, such as CVD deposited oxide, may alternatively be utilized. Once the fourth dielectric layer 1005 has been formed within the first opening 905 and the second opening 907.

After the fourth dielectric layer 1005 has been formed, a fifth photoresist 1009 may be formed to protect the fourth dielectric layer 1005 in the second resistor region 705 and expose the fourth dielectric layer 1005 in the first type of resistor region 707. The fifth photoresist 1009 may be similar to the first photoresist 301, and may be formed in a similar fashion as described above with respect to FIG. 3. For example, the fifth photoresist 1009 may be a DUV photoresist and may be applied using a spin-coating technique, although other suitable materials and methods may alternatively be utilized. After the fifth photoresist 1009 has been applied, the fifth photoresist 1009 may be patterned using an exposure and developing process in order to protect the protect the fourth dielectric layer 1005 in the second resistor region 705 while exposing the fourth dielectric layer 1005 in the first type of resistor region 707.

Figure 11:
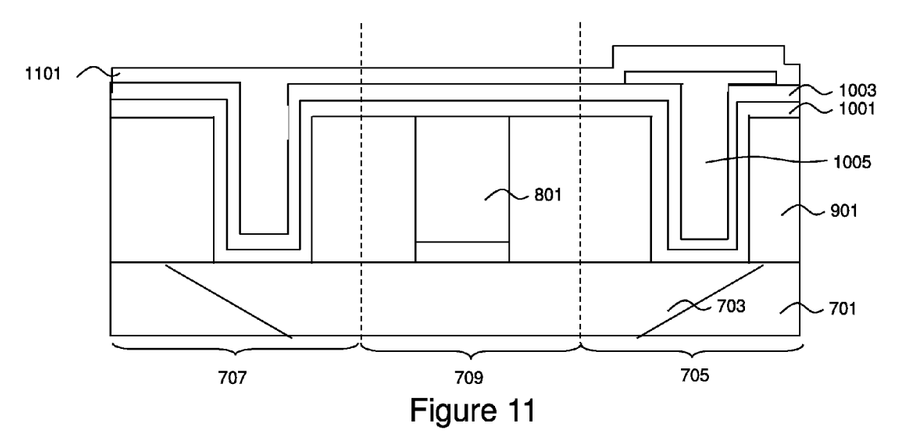
FIG. 11 illustrates a formation of metal for a metal gate in accordance with an embodiment.

FIG. 11 illustrates a removal of the fourth dielectric layer 1005 from the first type of resistor region 707. The fourth dielectric layer 1005 may be removed using a suitable removal process such as a wet or dry etching process. In an embodiment the fourth dielectric layer 1005 may be removed from the first type of resistor region 707 using an etchant such as $CF_4$ and $CHF_3$.

Once the fourth dielectric layer 1005 has been removed from the first type of resistor region 707, a fourth metal layer 1101 may be formed in the opening left behind by the removal of the fourth dielectric layer 1005 in the first type of resistor region 707. The fourth metal layer 1101 may be a metal such as aluminum and may be formed using a deposition process such as CVD, PVD, ALD, or the like. The fourth metal layer 1101 may be deposited to fill and overfill the opening left behind by the removal of the fourth dielectric layer 1005 in the first type of resistor region 707. However, because the fourth dielectric layer 1005 remains within the second resistor region 705, the fourth metal layer 1101 is formed on top of the remaining fourth dielectric layer 1005 in the second resistor region 705 instead of in its place.

Figure 12:
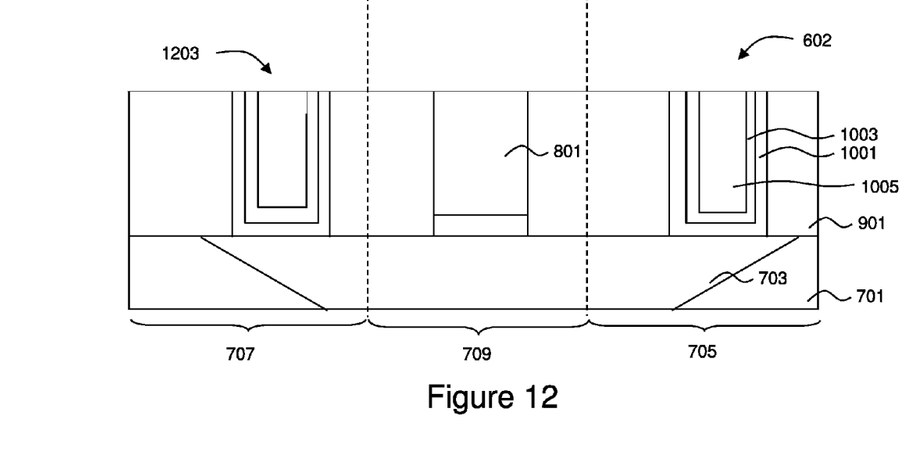
FIG. 12 illustrates a planarization process to help form a resistor and a metal resistor in accordance with an embodiment.

FIG. 12 illustrates a planarization process that may be utilized to help form the resistor 602 and the first type of resistor 1203. In an embodiment the planarization process may be used to remove any excess material from over the third ILD layer 901, such as any portion of the third dielectric layer 1001 or the third metal layer 1003 that remains over the third ILD layer 901. This removal process also electrically separates and isolates the resistor 602 from the first type of resistor 1203. The planarization process may be a CMP process, although any other suitable process may alternatively be utilized.

Once the first type of resistor 1203, the second type of resistor 801, and the resistor 602 have been formed, they may be interconnected to each other and to other active and passive devices on the semiconductor substrate 101. For example, a series of alternating conductive and insulating layers may be formed over the first type of resistor 1203, the second type of resistor 801, and the resistor 602, including contacts to make electrical connection to the first type of resistor 1203, the second type of resistor 801, and the resistor 602. These interconnecting layers of conductive and insulative materials provide the desired circuitry to connect the first type of resistor 1203, the second type of resistor 801, and the resistor 602 as desired to either internal or external devices.

By utilizing the steps described above with respect to FIGS. 7-12, the resistor 602 may be incorporated into a semiconductor device with other types of resistors (such as the first type of resistor 1203 and the second type of resistor 801). Additionally, the resistor 602 may be easily integrated with the manufacturing process as the addition of the resistor 602 uses only only a single additional mask in the form of the fifth photoresist 1009. Such an easy incorporation makes the manufacturing process more efficient and higher quality resistors may be manufactured at a faster pace and less money.

In accordance with an embodiment, a semiconductor device comprising a first dielectric layer over a semiconductor substrate and an opening within the first dielectric layer is provided. A second dielectric layer lines the opening, and a barrier metal layer overlies the second dielectric layer within the opening. A gate metal layer overlies the barrier metal layer within the opening, and a third dielectric layer is over the gate metal layer, wherein the barrier metal layer and the gate metal layer form a first resistor.

In accordance with another embodiment, a semiconductor device comprising a first resistor on a substrate is provided. The first resistor comprises a U-shaped first metal layer comprising a first metal and a U-shaped second metal layer adjacent to the first metal layer, the second metal layer comprising a second metal. A dielectric material is located within the U-shaped second metal layer, and a U-shaped dielectric layer is located adjacent to the first metal layer.

In accordance with yet another embodiment, a semiconductor device comprising a first resistor on a semiconductor substrate, the first resistor comprising a first top layer, is provided. A second resistor is on the semiconductor substrate, the second resistor a second top layer, wherein the second top layer comprises a different material than the first top layer.

Although the present embodiments and their advantages have been described in detail, it should be understood that various changes, substitutions and alterations can be made herein without departing from the spirit and scope of the disclosure as defined by the appended claims. For example, the precise order of steps utilized to form the resistors and CMOS devices may be altered while still remaining within the scope of the embodiments. Additionally, different materials may alternatively be utilized.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
 a first resistor on a semiconductor substrate, the first resistor comprising a first top layer; and
 a second resistor on the semiconductor substrate, the second resistor comprising a second top layer, wherein the second top layer comprises a different material than the first top layer, wherein each of the first and second resistors are disposed over a contiguous isolation feature.

2. The semiconductor device of claim 1, wherein the first resistor is a polysilicon resistor.

3. The semiconductor device of claim 1, further comprising a third resistor on the semiconductor substrate, the third resistor having a third top layer, the third top layer comprising a different material than the first top layer and the second top layer.

4. The semiconductor device of claim 3, wherein the first resistor is a polysilicon resistor and the third resistor is a metal resistor.

5. The semiconductor device of claim 1, wherein the second top layer has a "U" shape.

6. The semiconductor device of claim 5, further comprising spin on glass within the "U" shape of the second top layer.

7. A semiconductor device comprising:
   a first resistor over a shallow trench isolation within a semiconductor substrate, wherein the first resistor has a first top material, wherein the first top material within the first resistor has a first shape; and
   a second resistor over the substrate, wherein the second resistor has the first top material, wherein the first top material within the second resistor is planar with the first resistor and has a second shape different from the first shape and wherein the second resistor is over the shallow trench isolation.

8. The semiconductor device of claim 7, further comprising a third resistor over the shallow trench isolation, the third resistor having at least one different layer than each of the first and second transistors.

9. The semiconductor device of claim 7, wherein the first top material has a "U" shape.

10. The semiconductor device of claim 9, further comprising a dielectric material filling an interior of the "U" shape.

11. The semiconductor device of claim 7, further comprising a third resistor over the shallow trench isolation, wherein the third resistor has a second top material that is different from the first top material.

12. The semiconductor device of claim 11, wherein the second resistor is a polysilicon resistor.

13. The semiconductor device of claim 12, wherein the first resistor is a first metal resistor.

14. The semiconductor device of claim 13, wherein the third resistor is a second metal resistor.

15. A semiconductor device comprising:
   a dielectric layer within a substrate; and
   a first resistor on the dielectric layer, wherein the first resistor comprises:
      a first region with a first longitudinal axis perpendicular with a major surface of the substrate, the first region having a first height and a first top surface, the first top surface comprising a first material;
      a second region with a second longitudinal axis perpendicular with the major surface of the substrate, the second region having the first height; and
      a third region extending between the first region and the second region, wherein the third region has a second height smaller than the first height; and
   a second resistor on the dielectric layer, wherein the second resistor has a second top surface planar with the first top surface, the second top surface comprising a second material different from the first material, and wherein the dielectric layer extends from a sidewall of the first resistor to a sidewall of the second resistor.

16. The semiconductor device of claim 15, wherein the second material is polysilicon.

17. The semiconductor device of claim 16, wherein the first material is a metal.

18. The semiconductor device of claim 15, further comprising a third resistor, the third resistor comprising:
   a fourth region with a third longitudinal axis perpendicular with the major surface of the substrate, the fourth region having the first height;
   a fifth region with a fourth longitudinal axis perpendicular with the major surface of the substrate, the fifth region having the first height; and
   a sixth region extending between the fourth region and the fifth region, wherein the third region has a third height smaller than the first height.

19. The semiconductor device of claim 18, wherein the third resistor comprises a metal.

20. The semiconductor device of claim 19, wherein the metal comprises titanium nitride.

* * * * *